US007656175B2

(12) United States Patent
Fukushima et al.

(10) Patent No.: US 7,656,175 B2
(45) Date of Patent: Feb. 2, 2010

(54) INSPECTION UNIT

(75) Inventors: Yasuo Fukushima, Gunma (JP); Takuto Yoshida, Tokyo (JP)

(73) Assignee: Yokowo Co., Ltd., Tokyo (JP)

( * ) Notice: Subject to any disclaimer, the term of this patent is extended or adjusted under 35 U.S.C. 154(b) by 372 days.

(21) Appl. No.: 11/644,938

(22) Filed: Dec. 26, 2006

(65) Prior Publication Data

US 2007/0145990 A1 Jun. 28, 2007

(30) Foreign Application Priority Data

Dec. 27, 2005 (JP) ............................ 2005-374268

(51) Int. Cl.
*G01R 31/02* (2006.01)

(52) U.S. Cl. ...................................................... 324/754

(58) Field of Classification Search ................. 324/765, 324/754, 761–762, 760, 758, 158.1; 257/48; 438/14–18; 439/63, 66
See application file for complete search history.

(56) References Cited

U.S. PATENT DOCUMENTS 4,724,180 A * 2/1988 Kern .......................... 428/131
4,931,726 A * 6/1990 Kasukabe et al. ........... 324/754
6,953,348 B2 * 10/2005 Yanagisawa et al. .......... 439/66

FOREIGN PATENT DOCUMENTS

JP 2001-99889 A 4/2001

* cited by examiner

*Primary Examiner*—Ha Tran T Nguyen
*Assistant Examiner*—Tung X Nguyen
(74) *Attorney, Agent, or Firm*—Morgan, Lewis & Bockius LLP

(57) ABSTRACT

An insulative block has a first face adapted to oppose a board on which an inspection circuit is arranged and a second face adapted to oppose a device to be inspected. The insulative block is formed with first through holes each of which communicates the first face and the second face. A conductive first plating layer is formed on the first face, the second face, and an inner face of at least one of the first through holes. Each of contact probes includes a conductive tubular body held in an associated one of the first through holes and a plunger which is retractably projected from one end of the tubular body and is adapted to come in contact with a terminal of the device.

3 Claims, 4 Drawing Sheets

RELATED ART

INSPECTION UNIT

BACKGROUND

The present invention relates to an inspection unit for a high-frequency/high-speed device for ensuring reliable connection between the inspection unit and the device to be inspected, on occasion of inspecting its electrical performance, before a module of a high-frequency/high-speed circuit such as an amplifier circuit, a mixer circuit, a filter circuit, a memory, a CPU, etc. or an IC to be incorporated in a mobile phone, for example, is assembled to a circuit board. In this specification, the term "high-frequency" refers to an analogue signal having a high-frequency (1 GHz or more), while the term "high-speed" refers to a digital signal having very narrow pulse width and short pulse interval, and both of which are hereinafter collectively referred to as RF (radio frequency).

On occasion of inspecting electrical performance of the RF device such as a semiconductor wafer, an IC, or a module, insufficient contacts between the terminals may particularly cause fluctuation of impedance or other measurement factors, which may sometimes vary to change measured values. Under the circumstances, such inspection is conducted by a special inspection unit, for example, as shown in FIG. 8A (disclosed in Japanese Patent Publication No. 2001-99889A). In such an inspection, an RF circuit, which is the device to be inspected, is constructed in a form of a module 50 including an amplifier circuit and a mixer circuit, and is housed in a metal casing for avoiding interference with the exterior. The module 50 includes input and output terminals 51, 54 for RF signals, a power supply electrode terminal 52, and a grounding terminal 53, which are provided on a back face of the metal casing. Then, the inspection is conducted by electrically connecting the terminals to respective terminals of a wiring board 66 on which certain wirings for the inspection are arranged.

In this example, there are employed contact probes each having a spring and a plunger contained in a metal pipe, one end of the plunger being adapted to be projected to the exterior by the spring and contracted when pushed. The respective electrode terminals are connected by contact probes 63 for RF signals, a contact probe 64 for power supply, and a contact probe 65 for grounding which are contained in a metal block 61 for preventing them from being affected by noises. Each of the contact probes 63 for RF signals is formed in a coaxial structure, using the contact probe as a core conductor and using an inner wall of a through hole in the metal block 61 as an outer conductor, especially for preventing intrusion of noises. In this example, the contact probe is so constructed that a hollow space is formed between the inner conductor (the RF contact probe 63) and the outer conductor (the inner wall of the through hole in the metal block 61) of the coaxial structure so as to obtain a smaller diameter of the contact probe in order to cope with the narrow pitch. For this reason, insulating O-rings 69 are fitted to the contact probe 63 for RF signal, as shown in a partially enlarged view of FIG. 8B, so that the contact probe 63 for RF signal can be held in the hollow space.

Meanwhile, the contact probe 65 for grounding is inserted into the metal block 61 with a ground socket 65*a* being interposed, thereby to avoid deformation and to obtain favorable contact with the metal block 61. On the other hand, the contact probe 64 for power supply is inserted into the metal block 61 with an insulating tube 64*a* being interposed so as not to come into contact with the metal block 61. In FIG. 8A, denoted by numeral 67 is a coaxial cable, and 68 is a plate for retaining the metal pipes which form outer shells of the contact probes. Also in the case of an IC socket for inspecting the IC, the structure around the contact probe is almost the same, though it has a different outer shape.

As described above, it is possible to reduce a diameter of each through hole, in a case where a metal block is employed and a coaxial structure is formed by making a hollow space between the inner wall of the metal block as an outer conductor and a probe for RF signal as an inner conductor. This enables the whole unit can be made small, and it is possible to inspect even the device in which the electrode terminals are provided at a narrower pitch, while regulating the impedance. However, it is necessary to form through holes in the metal block 61 formed of metal such as brass or aluminum at a pitch of about 0.4 to 1 mm, requiring high manufacturing accuracy of about ±10 μm. Under the circumstances, there is a problem that it is difficult to substitute the metal block with a die-casting product, and even though it is substituted with the die-casting product, the through holes must be respectively produced by cutting works, which will lead to enormous increase of production cost.

Additionally, the probe for power supply must be isolated from the metal block. In a case where an interval between the contact probes is so set as to have a narrow pitch less than 0.5 mm, for example, a diameter of the probe for power supply must be inevitably smaller in order to cover the contact probe for power supply with an insulating tube. Therefore, there are such problems that cost for inserting the insulating tube will increase, and that contact resistance will increase in the probe for power supply.

SUMMARY

It is therefore one advantageous aspect of the invention to easily provide, at a low cost, an inspection unit for a high-frequency and high-speed device which can regulate high-frequency impedance while preventing intrusion of exterior noises as in a unit employing a metal block, and can use a probe for RF signal having a coaxial structure even in a case where contact probes (electrode terminals) are arranged at a narrow pitch.

It is also one advantageous aspect of the invention to provide an inspection unit for a high-frequency and high-speed device in which an inner wall of a through hole for a probe which needs not to be shielded, such as a probe for power supply, is not formed as a metal wall, whereby cost for covering a probe for power supply with an insulating tube can be reduced, and a diameter of the probe for power supply can be made as large as possible.

According to one aspect of the invention, there is provided an inspection unit, comprising:

an insulative block, having a first face adapted to oppose a board on which an inspection circuit is arranged and a second face adapted to oppose a device to be inspected, the insulative block being formed with first through holes each of which communicates the first face and the second face;

a conductive first plating layer, formed on the first face, the second face, and an inner face of at least one of the first through holes; and a plurality of contact probes, each of which comprises a conductive tubular body held in an associated one of the first through holes and a plunger which is retractably projected from one end of the tubular body and is adapted to come in contact with a terminal of the device.

The contact probes may include a signal contact probe adapted to transmit an RF signal and held in one of the first through holes the inner face of which is provided with the first plating layer, in such a manner that a gap is formed between an outer periphery of the tubular body and the inner face.

The inspection unit may further comprise a retainer, opposing at least one of the first face and the second face of the insulative block and holding the signal contact probe coaxially with the one of the through holes. The retainer may comprise: an insulative member, formed with a second through hole communicating with one of the first through holes; and a conductive second plating layer, formed on at least a part of an outer face of the insulative member and an inner face of the second through hole.

The contact probes may include a power supply contact probe adapted to supply power. The first through holes may include at least one through hole an inner face of which is not provided with the first plating layer, and adapted to hold the power supply contact probe.

With the above configuration, because the plating layer is formed on the insulative block, it is possible to produce a large number of the insulative blocks by injection molding or the like, with an accurate size. Moreover, because the surface of the insulative block is covered with the plating layer, the interior of the insulative block can be shielded, and substantially the same function as the metal block can be performed.

Further, the inner wall of the through hole can serve as the outer conductor of the coaxial structure, while the contact probe for RF signal is made as the core conductor (the inner conductor) of the coaxial structure, and the gap between the core conductor and the outer conductor can be made hollow so as to cope with the downsizing requirement.

Accordingly, the inspection unit according to the invention can be manufactured very easily, as compared with the case where the through holes are individually formed in the metal block by drilling work. Therefore, it is possible to perform substantially the same function as the case where the conventional metal block is employed, while attaining remarkable cost reduction.

Still further, by employing such structure that the plating layer is not provided in the through hole for inserting the contact probe for power supply, even when the contact probe for power supply comes into contact with the inner wall of the through hole in the insulative block, the contact probe will get in touch with only the exposed face of the insulative block, because the plating layer is not formed thereon. Accordingly, short circuit will not be formed. Therefore, there is no necessity of making the contact probe for power supply smaller than required, but the contact probe for power supply can be made as large as possible in diameter, as far as it can be inserted into the through hole, and very high performance in terms of contact resistance can be also obtained.

DETAILED DESCRIPTION OF EXEMPLARY EMBODIMENTS

Exemplary embodiments of the invention will be described below in detail with reference to the accompanying drawings.

Figure 1A:
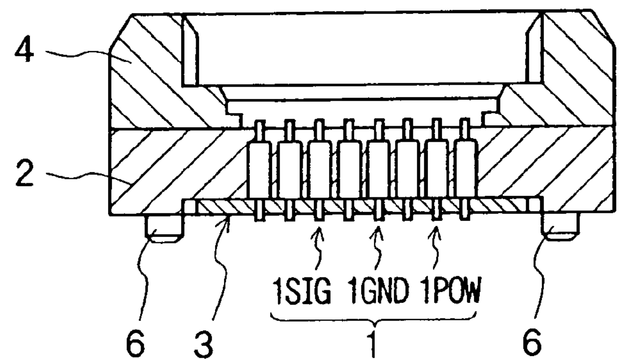
FIG. 1A is a section view of an IC socket according to one embodiment of the invention.
Figure 1B:
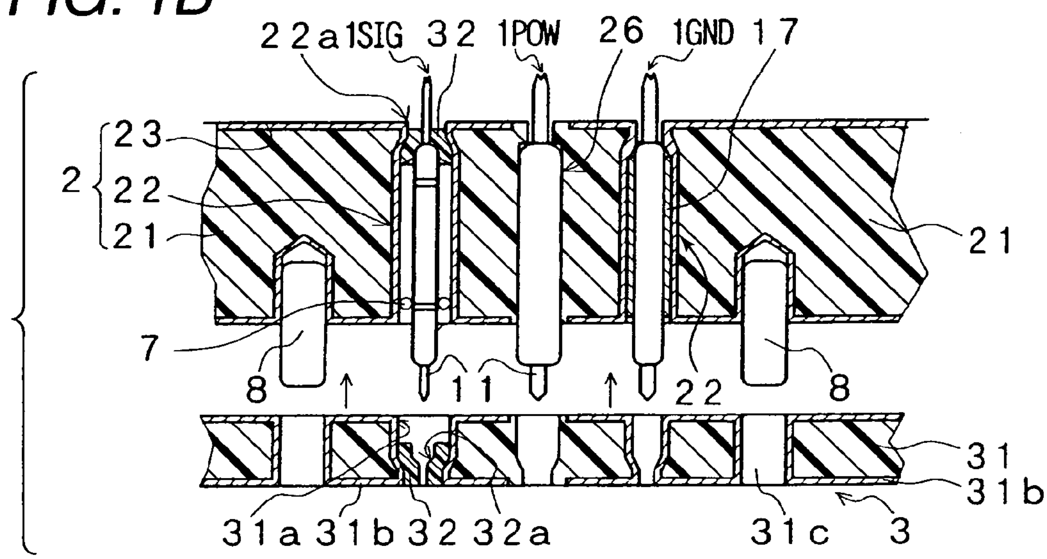
FIG. 1B is an enlarged section view of contact probes, a grounding block and a retainer in the IC socket, showing a disassembled state.

As shown in FIG. 1B, in an IC socket according to one embodiment of the invention, an insulative block 21 is provided with through holes 22 into which a probe 1SIG for RF signal, a probe 1GND for grounding, and a probe 1POW for power supply (herein, the probes for low-frequency and low-speed are treated in the same manner) can be inserted. By providing a plating layer 23 on an outer face of the insulative block 21 and on exposed faces of at least a part of the through holes 22, a grounding block 2 is formed. The above mentioned probe 1SIG for RF signal, probe 1GND for grounding, and probe 1 POW for power supply are inserted into the through holes 22 in this grounding block 2, and electrode terminals of a device to be inspected such as an IC (not shown) which is provided on one face of the grounding block 2 are connected to wiring terminals on a wiring board which is provided on the other face of the grounding block 2 and connected to an inspection device (not shown) by the respective probes 1, whereby inspection is performed.

Specifically, the grounding block 2 is not formed of a metal block, but formed of the plating layer 23 which is provided on the outer face of the insulative block 21 such as a resin block and on inner faces of at least a part of the through holes 22. Grounding the plating layer 23, the grounding block 2 can serve as substantially same as the metal block provided in the inspection unit described in the background section of the specification.

In this embodiment, one end portion of the contact probe 1 (1SIG, 1GND and 1POW) is held within the through hole 22 by a recess having a stepped part 22*a* which is formed on a top face of the insulative block 21, while the other end portion of the contact probe 1 is retained by a retainer 3 which is provided on a bottom face of the insulative block 21. The plating layer 23 is formed all over the outer faces of the insulative block 21 and a plating layer 31*a* is formed all over the outer faces of an insulative plate 31, the latter being used as the retainer 3.

As shown in FIG. 1A, a device guide 4 is mounted on the upper face of the grounding block 2 and positioning pins 6 are inserted into holes formed on the bottom face of the grounding block 2. The IC socket is mounted on a wiring board (not shown) through the use of the positioning pins 6 to connect the respective contact probes 1 to an inspection circuit provided on the wiring board. Inserting an inspected device such as an IC into a recess formed on the device guide 4, terminals of the inspected device are electrically connected to the inspection circuit through the contact probes 1.

Figure 2:
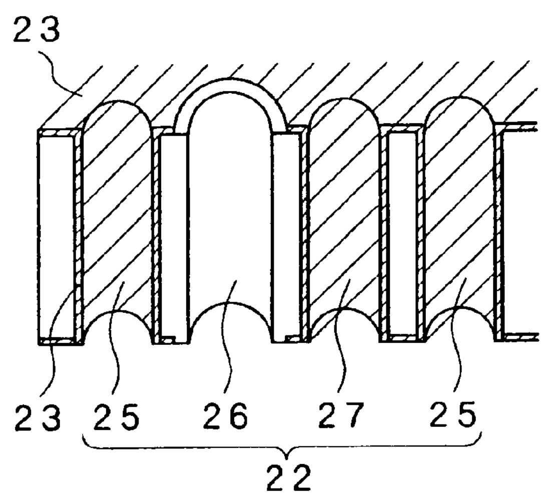
FIG. 2 is a perspective, partial section view of through holes formed in the grounding block.

As shown in FIG. 2, the plating layer 23 is formed by applying plating to the whole outer face of the insulative block 21 and the exposed faces of all the through holes 22 except a through hole 26 for inserting the probe 1POW for power supply. In this figure, an area where the plating layer 23 is formed is hatched. The through holes 22 into which the probe for RF signal and a ground socket will be inserted are provided with the plating layer 23 on inner faces thereof as well as on the outer faces. Further, the plating layer 23 is not formed on a circumferential edge of the through hole 26.

The plating layer 23 is formed of an Ni plating of about 2 to 3 μm which is formed by electroless nickel plating for example, and an Au plating of about 3 μm or less which is successively formed thereon by electroless plating. In this case, a plating resist may be applied to or a plating prevention pin may be inserted into the through hole which should not provide with the plating layer, so that the inner face of such a through hole may not get in touch with plating solution, whereby formation of the plating layer can be easily prevented. Alternatively, it is possible to partly remove the plating layer after the plating layer is formed on the whole surface.

Figure 3:
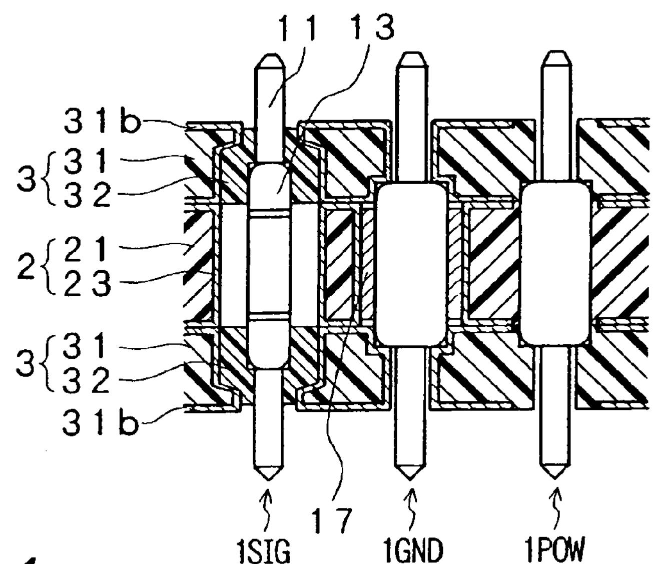
FIG. 3 is an enlarged section view of contact probes, a grounding block and retainers in an IC socket according to a modified example.
Figure 4:
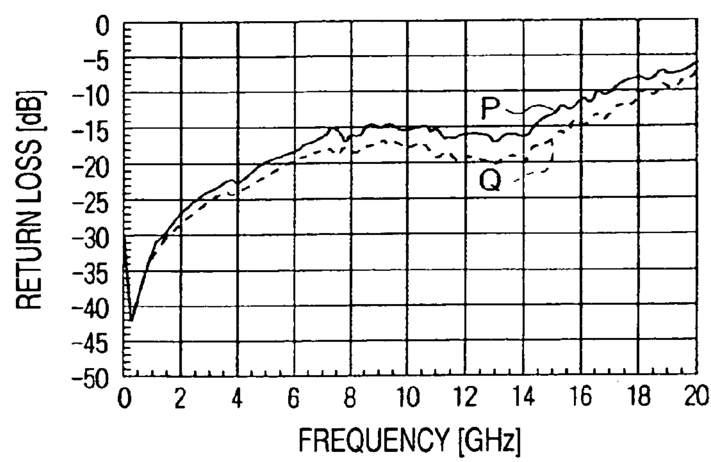
FIG. 4 is a graph comparing return loss characteristics of contact probes for RF signal in the IC socket of the invention with those in a conventional IC socket.
Figure 5:
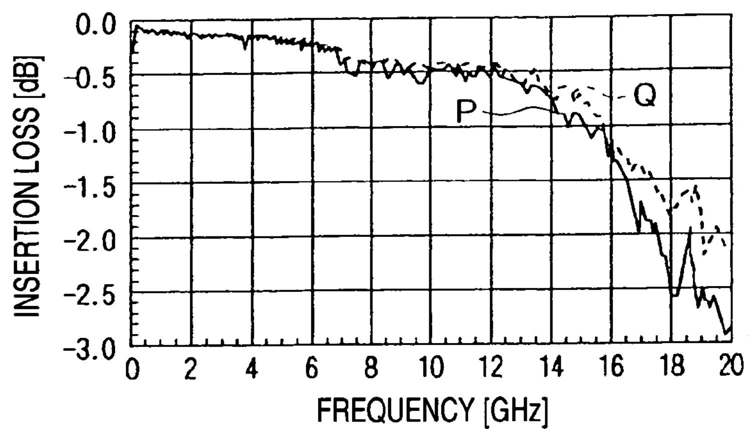
FIG. 5 is a graph comparing insertion loss characteristics of the contact probes for RF signal in the IC socket of the invention with those in the conventional IC socket.
Figure 6:
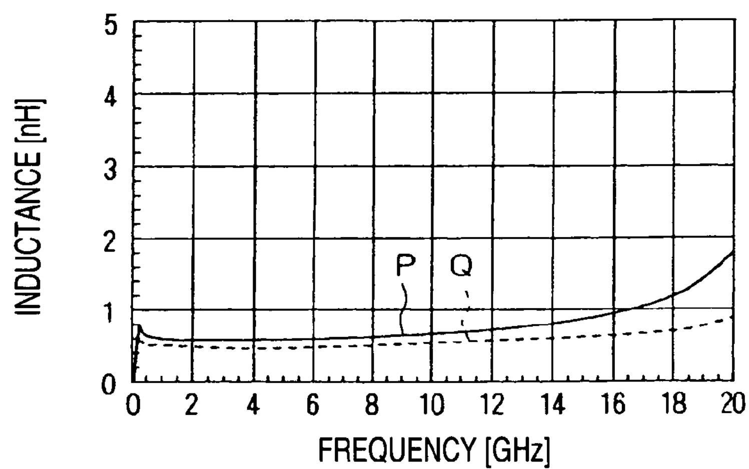
FIG. 6 is a graph comparing device-side inductance characteristics of contact probes for grounding in the IC socket of the invention with those in the conventional IC socket.
Figure 7:
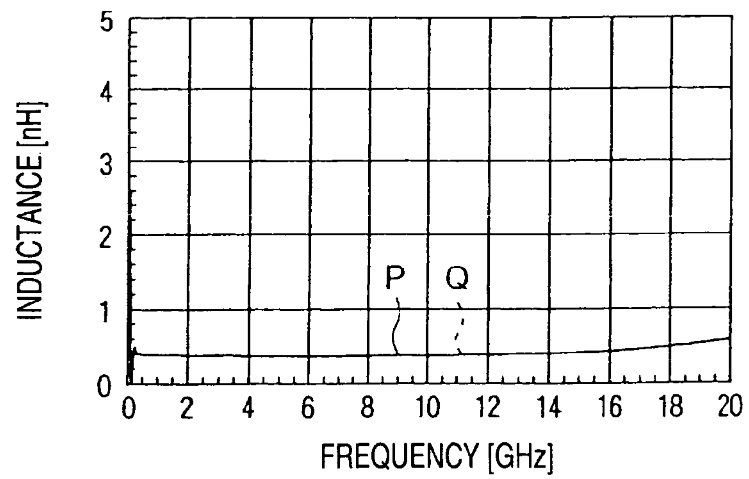
FIG. 7 is a graph comparing board-side inductance characteristics of the contact probes for grounding in the IC socket of the invention with those in the conventional IC socket.
Figure 8A:
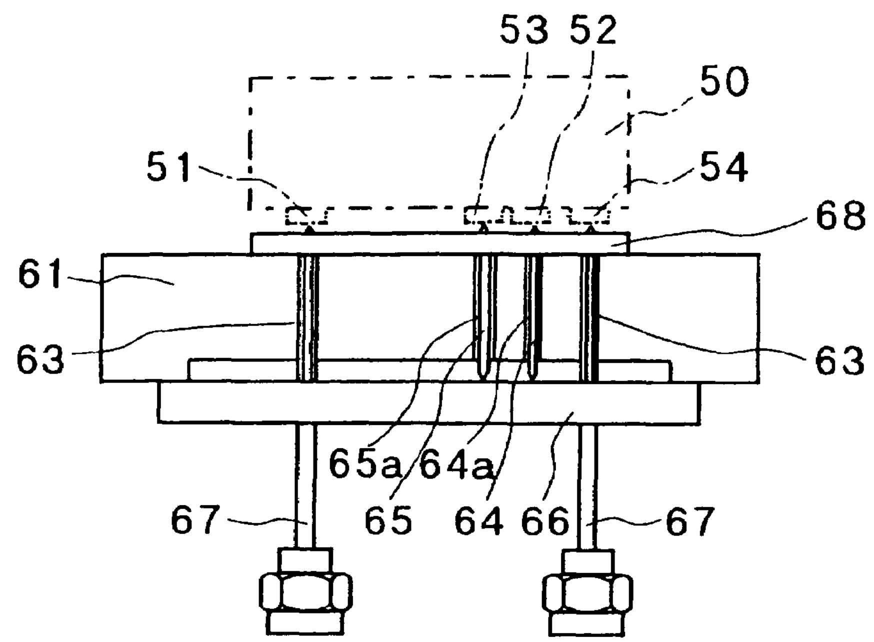
FIG. 8A is a schematic section view of a conventional inspection unit.
Figure 8B:
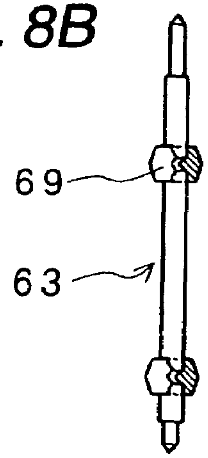
FIG. 8B is a partial section view of a contact probe in the conventional inspection unit.

As described above, the respective probes 1 can be held by the insulative block 21 provided with the plating layer 23 and the insulative plate 31 provided with the plating layer 31*b*. However, as shown in FIG. 3, it is possible to provide the insulative plates 31 on both the top and bottom faces of the grounding block 2. In this case, the plating layer 31*b* may be formed on the outer faces of the respective insulative plates 31. On the other hand, in a case where the insulative plates 31 are very thin as compared with the insulative block 21, RF performance will not be remarkably deteriorated even though the insulative plates 31 are not provided with the plating layer 23, so far as the plating layer 23 is formed on the outer face of the insulative block 21 and the exposed faces of at least one or some of the through holes 22.

In the above-mentioned embodiment, the inspection unit can be of the same structure as the conventional inspection unit employing the metal block, except that the grounding block 2 is formed by providing the plating layer 23 on the outer face of the insulative block 21. Specifically, as shown in FIGS. 1A and 1B, the contact probes 1 (1SIG, 1POW, 1GND) are inserted into the through holes 22 (25, 26, 27 in FIG. 2) in the grounding block 2 which is provided with the plating layer 23, and are retained by the retainer 3.

This probe 1SIG for RF signal is formed in a coaxial structure making the contact probe 1 inserted into the through hole 25 for the RF signal probe as an inner conductor and the plating layer 23 formed on the exposed area of the through hole 22 as an outer conductor. The probe 1GND for grounding is provided with a ground socket 17 so as to be connected to the plating layer 23 which is formed in the through hole 27 for the grounding probe, and the ground socket 17 is fixed by insertion of the contact probe 1GND for grounding into the ground socket 17. The probe 1POW for power supply (including probes for low-frequency and low-speed signals) is inserted into the through hole 26 for the power supply probe, where the plating layer is not provided on the inner wall thereof.

However, in a case where there is a sufficient space within the through hole 26, the plating layer may be also formed on the inner wall thereof, and the probe 1POW for power supply may be inserted into the through hole 26 while interposing an insulating tube. In the above-mentioned embodiments, the contact probes of a type that a pin at a distal end thereof is movable by a spring or the like are employed. However, an ordinary contact pin which is not provided with a movable pin may be employed.

Figure 1C:
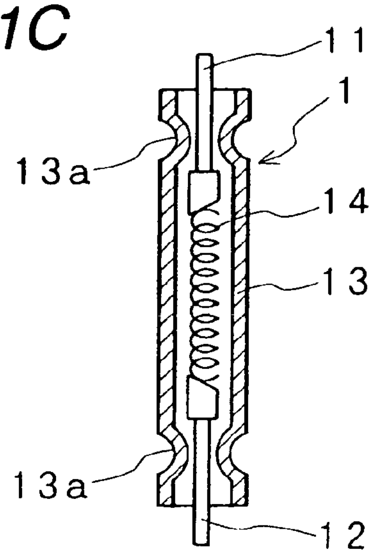
FIG. 1C is a section view of one of the contact probes.

As shown in FIG. 1C, the contact probe 1 has such a structure that a spring 14 and one ends of the plungers 11, 12 are contained in a metal pipe 13, and the plungers 11, 12 are held so as not to escape from the metal pipe 13 by neck portions 13*a* formed in the metal pipe 13, and to be urged outwardly by the spring 14. When the tip ends of the plungers 11, 12 are pressed, the spring 14 will be contracted so that the tip ends may be pushed into the metal pipe 13, and while no force is applied, the tip ends of the plungers 11, 12 are projected by about 1 mm, for example. Although the plungers 11, 12 are provided at both ends of the contact probe, depending on the structure of an inspection unit, it may be sufficient that the plunger 11 is provided on at least one side of the contact probe which comes into contact with the device to be inspected.

The metal pipe 13 has a length of about a few millimeters and may be formed of nickel silver (copper, nickel, zinc alloy) for example. As the plungers 11, 12, a wire member having a diameter of about 0.1 mm and formed of SK material or beryllium copper may be used. The spring 14 may be formed of a piano wire or the like.

The contact probes 1 may have substantially the same structure irrespective of their uses, namely for signal, for power supply and for grounding. However, the contact probe 1SIG for RF signal is so formed as to satisfy a prescribed relationship between its outer diameter and an inner diameter of the plating layer 23 inside the through hole 25, in order to establish the coaxial structure in which the inner wall of the through hole 25 in the grounding block 2 as the outer conductor. In a case where the probes are arranged in a matrix manner at a pitch of 0.4 mm, the outer diameter of the probes is set to be about 0.15 mm, and the inner diameter of the plating layer 23 is set to be about 0.35 mm. It would be desirable that the contact probe 1POW for power supply and the contact probe 1GND for grounding are as thick as possible, and may be formed having such a size to be inserted into the through holes 26, 27 having substantially the same size as the through holes 25 which are formed for the RF signal probes according to the pitch (In a case where the ground socket is used, the size will be smaller correspondingly).

The contact probe 1POW for power supply will not cause short circuit, because it is inserted into the through hole 26 which is not provided with the plating layer 23. However, the contact probe 1POW for power supply must be covered with the insulating tube which is not shown, in a case where it is inserted into the through hole provided with the plating layer. As to the contact probe 1GND for grounding, the ground socket 17 formed of phosphor bronze is inserted into the through hole 27, as shown in FIG. 1B, for the purpose of improving contact condition with the plating layer 23 in the through hole 27, and the contact probe 1GND for grounding will be inserted into the ground socket 17.

The insulative block 21 is formed of resin such as polyether imide (PEI), polyimide (PI), polyether ether ketone (PEEK), polyamide imide (PAI), by cutting work, molding work or the like, so that the above described through holes 22 for the contact probes 1 may be arranged in a matrix manner. Then, the above described plating layer 23 is provided in the through holes 25, 27 except the through hole 26 for the probe 1POW for power supply.

Thickness and dimension of this insulative block 21 may vary depending on its uses, for example, in a case where the inspection unit is used as the IC socket which simply interconnects the IC and the wiring board provided with the wirings, or in a case where the inspection unit is used as an inspecting tool to be connected to a board to which a coaxial cable or the like is connected. But usually, the insulative block 21 is formed having a thickness of about 3 to 8 mm, and an area of 30 to 50 mm square.

The retainer 3 includes the insulative plate 31 formed with the plating layer 31*b* on its surface, and an insulating spacer 32 which is provided on an area for the contact probe 1SIG for RF signal. Specifically, this insulative plate 31 has a through hole 31*a* through which the plunger 11 of the contact probe 1 is projected, and in which a stepped part is formed. The insulating spacer 32 is fitted with the stepped part of the through hole 31*a*, and provided with a through hole 32*a* through which the plunger 11 of the contact probe 1 is projected, and in which a stepped part is formed. More specifically, the stepped part formed in the insulating spacer 32 is so formed as to fit with an outer shape of the metal pipe 13 of the contact probe 1, so that the contact probe 1 may not escape from the metal block 2, while the plunger 11 is retractably projected.

The insulative plate 31 is formed of PEI, PI, PEEK or the like in the same manner as the insulative block 21 in a form of an insulating board having a thickness of about 1 to 2 mm. The insulating spacer 32 is formed of polyether imide (PEI) for example, having a thickness of about 0.5 mm. It is to be noted that the through holes 31*a* for the probes for grounding and power supply need not to provide with the insulating spacer. Denoted by numeral 31*c* is a through hole for the positioning pin 8.

In the embodiment shown in FIG. 1B, the retainer is not provided at the upper end side of the contact probe 1, and the stepped part 22*a* is formed in the through hole 22. An insulating spacer 32 having the same structure as described above is fitted with the stepped part, thereby to constitute the retainer. However, as shown in FIG. 3, it is also possible to provide the retainer 3 having the same configuration at the upper end side of the contact probe 1 as well.

In this embodiment, as shown in FIG. 1B, an O-ring 7 formed of silicone rubber or the like is inserted at the lower end side of the probe 1SIG for RF signal. Each of the contact probes 1 are individually inserted into the associated through hole 22 from the upper end side thereof. Then, the lower ends of the respective contact probes 1 are collectively inserted into the through holes 31*a* of the retainer 3. The O-ring 7 is provided in order to maintain the vertical attitude of the contact probe 1 when the lower end side of the contact probe 1 is covered with the retainer 3, thereby avoiding the interference between the lower end of the contact probe 1 and the through hole 31*a* of the retainer 3.

FIGS. 4 through 7 show comparisons between the conventional inspection unit employing the metal block and the inspection unit of the invention in which a grounding block is formed by providing a Ni plating of 2-3 μm in thickness and an Au flash-plating on an insulative block, and retainers provided with no plating are mounted on top and bottom faces of the grounding block, in connection with return loss of the contact probe for RF signal, insertion loss of the contact probe for RF signal, inductance of the contact probe for grounding at a side of the device, and wiring board-side inductance of the contact probe for grounding. The comparisons are made under the same condition. In the figures, P designates the inspection unit of the invention and Q designates the conventional inspection unit. As apparent from the results, it has been found that there is no significant difference in high-frequency performance between them, and they can be treated in the same manner.

As described above, according to the invention, by forming the plating layer such as Ni, Au or the like on the surface of the insulative block formed of resin or the like thereby to constitute the grounding block, it is possible to conduct inspection of the performances which is substantially equal to the inspection by the structure employing the conventional metal block. It is also possible to produce the grounding block having the through holes very easily by insertion molding or the like, without conducting drilling work performed with respect to the conventional metal block. It is also possible to easily obtain the grounding block by applying the plating layer to the desired places, and hence, remarkable cost reduction can be attained.

Although only some exemplary embodiments of the invention have been described in detail above, those skilled in the art will readily appreciated that many modifications are possible in the exemplary embodiments without materially departing from the novel teachings and advantages of the invention. Accordingly, all such modifications are intended to be included within the scope of the invention.

The disclosure of Japanese Patent Application No. 2005-374268 filed Dec. 27, 2006 including specification, drawings and claims is incorporated herein by reference in its entirety.

What is claimed is:

1. An inspection unit, comprising:

an insulative block, having a first face adapted to oppose a board on which an inspection circuit is arranged and a second face adapted to oppose a device to be inspected, the insulative block being formed with first through holes each of which communicates the first face and the second face;

a conductive first plating layer, formed on the first face, the second face, and an inner face of at least one of the first through holes; and a plurality of contact probes, each of which comprises a conductive tubular body held in an associated one of the first through holes and a plunger which is retractably projected from one end of the tubular body and is adapted to come in contact with a terminal of the device, wherein the contact probes include a power supply contact probe adapted to supply power; and the first through holes include at least one through hole an inner face of which is not provided with the first plating layer, and adapted to hold the power supply contact probe.

2. The inspection unit as set forth in claim 1, wherein:

the contact probes include a signal contact probe adapted to transmit an RF signal and held in one of the first through holes the inner face of which is provided with the first plating layer, in such a manner that a gap is formed between an outer periphery of the tubular body and the inner face.

3. The inspection unit as set forth in claim 2, further comprising:

a retainer, opposing at least one of the first face and the second face of the insulative block and holding the signal contact probe coaxially with the one of the through holes, the retainer comprising:

an insulative member, formed with a second through hole communicating with one of the first through holes; and a conductive second plating layer, formed on at least a part of an outer face of the insulative member and an inner face of the second through hole.

* * * * *